(12) United States Patent
Park et al.

(10) Patent No.: US 9,166,567 B2
(45) Date of Patent: Oct. 20, 2015

(54) DATA-RETAINED POWER-GATING CIRCUIT AND DEVICES INCLUDING THE SAME

(71) Applicants: Bong Il Park, Seongnam-si (KR); Andrew B. Kahng, La Jolla, CA (US); Seok Hyeong Kang, La Jolla, CA (US); Jae Gon Lee, Yongin-si (KR)

(72) Inventors: Bong Il Park, Seongnam-si (KR); Andrew B. Kahng, La Jolla, CA (US); Seok Hyeong Kang, La Jolla, CA (US); Jae Gon Lee, Yongin-si (KR)

(73) Assignees: UNIVERSITY OF CALIFORNIA, SAN DIEGO, La Jolla, CA (US); SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/210,892

(22) Filed: Mar. 14, 2014

(65) Prior Publication Data
US 2014/0266401 A1 Sep. 18, 2014

Related U.S. Application Data

(60) Provisional application No. 61/793,861, filed on Mar. 15, 2013.

(30) Foreign Application Priority Data

Feb. 26, 2014 (KR) .......................... 10-2014-0022696

(51) Int. Cl.
G05F 1/10 (2006.01)
G05F 3/02 (2006.01)
H03K 3/012 (2006.01)
H03K 3/356 (2006.01)

(52) U.S. Cl.
CPC .......... *H03K 3/012* (2013.01); *H03K 3/356008* (2013.01)

(58) Field of Classification Search
CPC .......................... H03K 3/012; H03K 3/356008
USPC ............................ 327/544; 365/226; 326/98
See application file for complete search history.

(56) References Cited

U.S. PATENT DOCUMENTS

| | | | | |
|---|---|---|---|---|
| 5,781,062 A | * | 7/1998 | Mashiko et al. | 327/544 |
| 6,091,656 A | * | 7/2000 | Ooishi | 365/226 |
| 6,433,584 B1 | * | 8/2002 | Hatae | 326/80 |
| 6,586,982 B2 | * | 7/2003 | Furusawa et al. | 327/225 |
| 6,859,084 B2 | * | 2/2005 | Stansfield et al. | 327/325 |

(Continued)

FOREIGN PATENT DOCUMENTS

| KR | 20090033969 A | 4/2009 |
|---|---|---|
| KR | 101045800 B1 | 7/2011 |

*Primary Examiner* — Kenneth B Wells
(74) *Attorney, Agent, or Firm* — Harness, Dickey & Pierce, P.L.C.

(57) ABSTRACT

A power-gating circuit and devices including the same are provided. The power-gating circuit includes a flip-flop configured to receive a first power supply voltage and a gated clock signal to operate and a switch circuit connected between a first power supply voltage source configured to supply the first power supply voltage and a second power supply voltage source configured to supply a second power supply voltage. The switch circuit includes a first switch configured to be connected between the first power supply voltage source and the second power supply voltage source and to operate in response to a clock enable signal and a second switch configured to be connected between the first power supply voltage source and the second power supply voltage source and to operate in response to the first power supply voltage.

16 Claims, 16 Drawing Sheets

(56) References Cited

U.S. PATENT DOCUMENTS

| | | | |
|---|---|---|---|
| 6,925,025 B2 * | 8/2005 | Deng et al. | 365/226 |
| 7,138,825 B2 * | 11/2006 | Kim et al. | 326/34 |
| 7,323,909 B2 * | 1/2008 | Mamidipaka | 326/93 |
| 7,492,192 B2 | 2/2009 | Kumata | |
| 7,576,582 B2 | 8/2009 | Lee et al. | |
| 7,619,440 B2 * | 11/2009 | Amedeo et al. | 326/33 |
| 7,750,680 B2 | 7/2010 | Mamidipaka | |
| 7,760,575 B2 * | 7/2010 | Tooher et al. | 365/226 |
| 7,861,192 B2 | 12/2010 | Chejara | |
| 7,908,499 B2 * | 3/2011 | Ito | 713/320 |
| 8,022,753 B2 * | 9/2011 | Ikeda | 327/544 |
| 8,207,756 B2 | 6/2012 | Shionoiri et al. | |
| 8,281,170 B1 | 10/2012 | Donovan | |
| 2008/0238514 A1 | 10/2008 | Kim | |
| 2011/0010684 A1 | 1/2011 | Sato et al. | |
| 2012/0268182 A1 | 10/2012 | Lee et al. | |

* cited by examiner

DATA-RETAINED POWER-GATING CIRCUIT AND DEVICES INCLUDING THE SAME

CROSS-REFERENCE TO RELATED APPLICATIONS

This application claims priority under 35 U.S.C. §119(a) to Korean Patent Application No. 10-2014-0022696 filed on Feb. 26, 2014, and under 35 U.S.C. §119(e) to U.S. Provisional Application No. 61/793,861 filed on Mar. 15, 2013, the disclosure of each of which is hereby incorporated by reference in its entirety.

BACKGROUND

Example embodiments of inventive concepts relate to an electronic circuit for reducing power consumption and retaining data and/or devices including the same.

Since mobile devices have limited battery capacity, operating current is reduced in order to increase the waiting time of the mobile devices. Also, with the development of microscopic processes, an amount of leakage current increases as compared to dynamic power.

A method of reducing the operating current of a system on chip (SoC) includes dividing the SoC into several power blocks and shutting off the current to unused blocks (i.e., using power gating). Clock gating is used for operating blocks to stop an operating clock signal of non-operating flip-flops. However, when the processes become microscopic and the operating temperature increases, leakage current occurs.

SUMMARY

Some example embodiments provide a power-gating circuit for reducing power consumption and retaining data and devices including the same.

According to an example embodiment of inventive concepts, there is provided a power-gating circuit including a flip-flop configured to receive a first power supply voltage and a gated clock signal to operate and a switch circuit connected between a first power supply voltage source configured to supply the first power supply voltage and a second power supply voltage source configured to supply a second power supply voltage. The switch circuit includes a first switch configured to be connected between the first power supply voltage source and the second power supply voltage source and to operate in response to a clock enable signal and a second switch configured to be connected between the first power supply voltage source and the second power supply voltage source and to operate in response to the first power supply voltage.

The power-gating circuit may further include a clock gating circuit configured to apply the gated clock signal to the flip-flop in response to a clock signal and the clock enable signal.

According to another example embodiment of inventive concepts, there is provided a power-gating circuit including a plurality of flip-flops configured to receive a first power supply voltage and a gated clock signal to operate and a switch circuit corresponding to each of the flip-flops and connected between a first power supply voltage source configured to provide the first power supply voltage and a second power supply voltage source configured to provide a second power supply voltage. The switch circuit includes a first switch configured to be connected between the first power supply voltage source and the second power supply voltage source and to operate in response to a clock enable signal and a second switch configured to be connected between the first power supply voltage source and the second power supply voltage source and to operate in response to the first power supply voltage.

According to another example embodiment of inventive concepts, there is provided a power-gating circuit including a flip-flop configured to receive a first power supply voltage, a second power supply voltage, and a gated clock signal to operate and a switch circuit connected between a first power supply voltage source configured to supply the first power supply voltage and the second power supply voltage source configured to produce a second power supply voltage. The flip-flop includes a latch configured to receive a third power supply voltage and the first power supply voltage and to latch an internal signal based on an input signal, a first drive transistor configured to be connected between a third power supply voltage source configured to supply the third power supply voltage and a node of an output signal, the first drive transistor configured to drive a flip-flop output signal to a level of the third power supply voltage in response to an output signal of the latch, and a second drive transistor configured to be connected between the node of the output signal and the second power supply voltage source, the second drive transistor configured to drive the flip-flop output signal to a level of the second power supply voltage in response to a gate voltage based on the flip-flop output signal, an input signal of the latch and an output signal of the latch.

According to another example embodiment of inventive concepts, there is provided a power-gating circuit including a first metal line to apply a first power supply voltage, a second metal line to apply a second power supply voltage, a third metal line to apply a third power supply voltage, a flip-flop cell corresponding to a layout of a flip-flop configured to receive the first power supply voltage and a gated clock signal to operate, a first switch connected to the first metal line and the second metal line and is configured to operate in response to a clock enable signal, and a second switch connected to the first metal line and the second metal line and is configured to operate in response to the first power supply voltage.

In an example embodiment, a power circuit includes at least one flip-flop configured to operate based on an operating mode of the power circuit, the operating mode being one of a first mode and a second mode and a switch circuit selectively coupled between a first power supply voltage source configured to supply a first power supply voltage and a second power supply voltage source configured to supply a second power supply voltage, the switch circuit configured to supply one of the first and second power supply voltages to the at least one flip-flop based on the operating mode, the switch circuit including at least a first switch having a threshold voltage and a difference between the first and second power supply voltages is the threshold voltage.

BRIEF DESCRIPTION OF THE DRAWINGS

The above and other features and advantages of inventive concepts will become more apparent by describing in detail example embodiments thereof with reference to the attached drawings in which.

DETAILED DESCRIPTION OF EXAMPLE EMBODIMENTS

Figure 1:
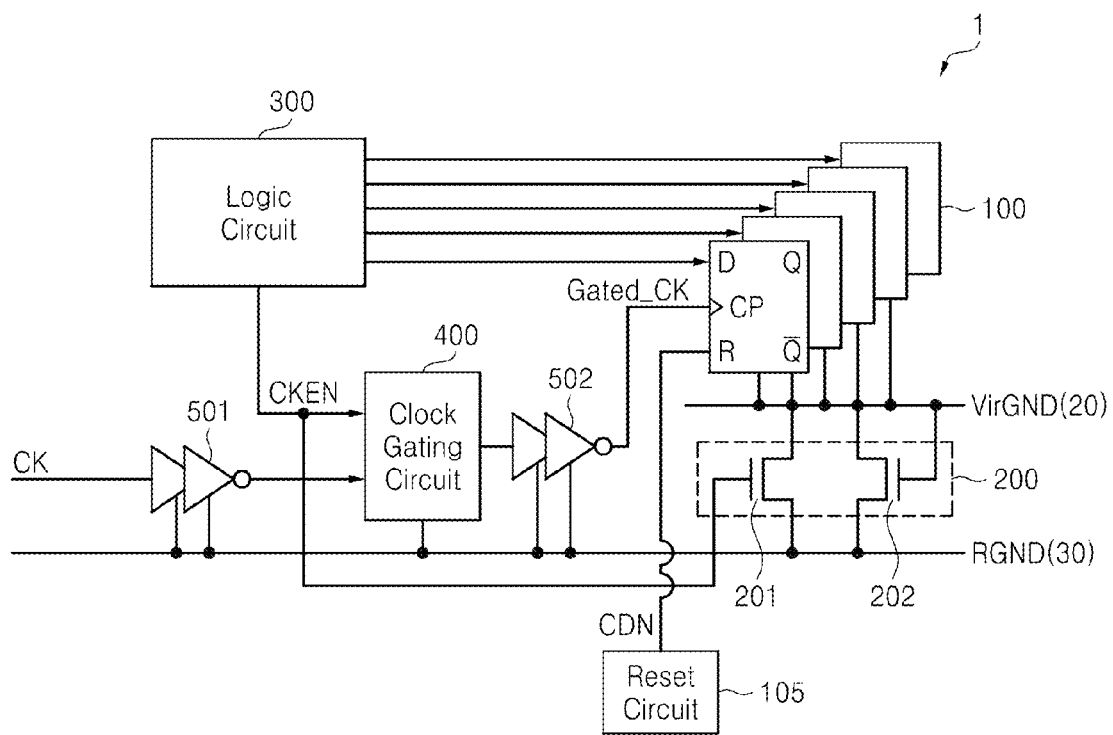
FIG. 1 is a block diagram of a power-gating circuit according to an example embodiment of inventive concepts.

Inventive concepts now will be described more fully hereinafter with reference to the accompanying drawings, in which example embodiments are shown. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing example embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a power-gating circuit 1 according to an example embodiment of inventive concepts. The power-gating circuit 1 includes at least one flip-flop 100, a switch circuit 200, a logic circuit 300, and a clock gating circuit 400.

The at least one flip-flop 100 includes a plurality of (at least two) D flip-flops, but inventive concepts are not restricted thereto. The type or the number of flip-flops may be changed. Each of the flip-flops 100 operates in response to a first power supply voltage VirGND and a gated clock signal Gated_CK. For instance, each flip-flop 100 may receive the gated clock signal Gated_CK through a clock terminal CP, may receive the first power supply voltage VirGND and a supply voltage (not shown) as operating voltages, and may generate an output signal Q or /Q according to an input signal D. The input signal D of each flip-flop 100 is output from the logic circuit 300.

The switch circuit 200 includes a first switch 201 and a second switch 202. The first switch 201 is connected between the first power supply voltage VirGND and a second power supply voltage RGND and operates in response to a clock enable signal CKEN. The second switch 202 is connected between the first power supply voltage VirGND and the second power supply voltage RGND and operates in response to the first power supply voltage VirGND. The first and second switches 201 and 202 may be implemented as N-channel metal oxide semiconductor (NMOS) transistors.

The logic circuit 300 provides the input signal D for each flip-flop 100 and generates the clock enable signal CKEN. The clock gating circuit 400 generates the gated clock signal Gated_CK in response to a clock signal CK and the clock enable signal CKEN and provides the gated clock signal Gated_CK for the flip-flop 100.

The clock gating circuit 400 outputs the clock signal CK as it is while the clock enable signal CKEN is being enabled (for example, being at a high level) and masks the clock signal CK while the clock enable signal CKEN is being disabled (for example, being at a low level). The clock gating circuit 400 may generate the gated clock signal Gated_CK by performing an AND operation on the clock enable signal CKEN and the clock signal CK, but inventive concepts are not restricted thereto.

The power-gating circuit 1 may also include an input clock buffer 501 and an output clock buffer 502. The input clock buffer 501 buffers and outputs the clock signal CK to the clock gating circuit 400. The output clock buffer 502 buffers and provides the gated clock signal Gated_CK output from the clock gating circuit 400 for the flip-flops 100. The input clock buffer 501 and the output clock buffer 502 may each include at least one buffer or inverter.

Figure 2A:
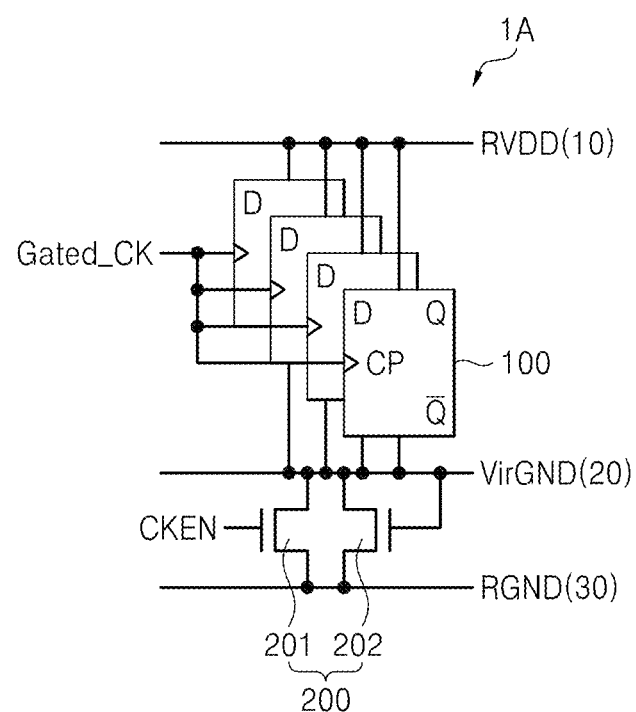
FIG. 2A is a block diagram of a power-gating circuit according to an example embodiment of inventive concepts.

FIG. 2A is a block diagram of a power-gating circuit 1A according to an example embodiment of inventive concepts. Referring to FIG. 2A, the power-gating circuit 1A includes at least one flip-flop 100 and the switch circuit 200.

The structure and functions of the flip-flop 100 and the switch circuit 200 illustrated in FIG. 2A are substantially the same as those of the flip-flop 100 and the switch circuit 200 illustrated in FIG. 1, but the flip-flop 100 illustrated in FIG. 2A receives a third power supply voltage RVDD as a supply voltage.

The power-gating circuit 1 illustrated in FIG. 1 and the power-gating circuit 1A illustrated in FIG. 2A perform both clock gating and power gating. The flip-flop 100 illustrated in FIGS. 1 and 2A may operate in at least two kinds of mode, e.g., an active mode and a data hold mode.

In the active mode, the clock enable signal CKEN is enabled (e.g., CKEN=1). The flip-flop 100 receives the third power supply voltage RVDD as a supply voltage and also receives the second power supply voltage RGND, i.e., a real ground voltage and performs a normal operation in response to the clock signal CK that has not been masked.

In the data hold mode, the clock enable signal CKEN is disabled (CKEN=0). Accordingly, the flip-flop 100 receives the third power supply voltage RVDD as the supply voltage and also receives the first power supply voltage VirGND, i.e., a virtual ground voltage. The first power supply voltage VirGND may be higher than the second power supply voltage RGND by a voltage drop caused by the second switch 202.

The second switch 202 may be implemented as a diode-connected NMOS transistor. In other words, the NMOS transistor forming the second switch 202 may have a diode connection in which a gate and a drain are connected with each other. In this case, a level difference between the first power supply voltage VirGND and the second power supply voltage RGND in the data hold mode may be a threshold voltage $V_{n\_th}$ of the NMOS transistor.

Since the clock signal CK is masked in the data hold mode, the flip-flop 100 retains data using the operating voltages RVDD and VirGND lower than the operating voltages RVDD and RGND used in the active mode. Accordingly, leakage current and power consumption are decreased in the flip-flop 100 in the data hold mode than in the active mode.

Figure 2B:
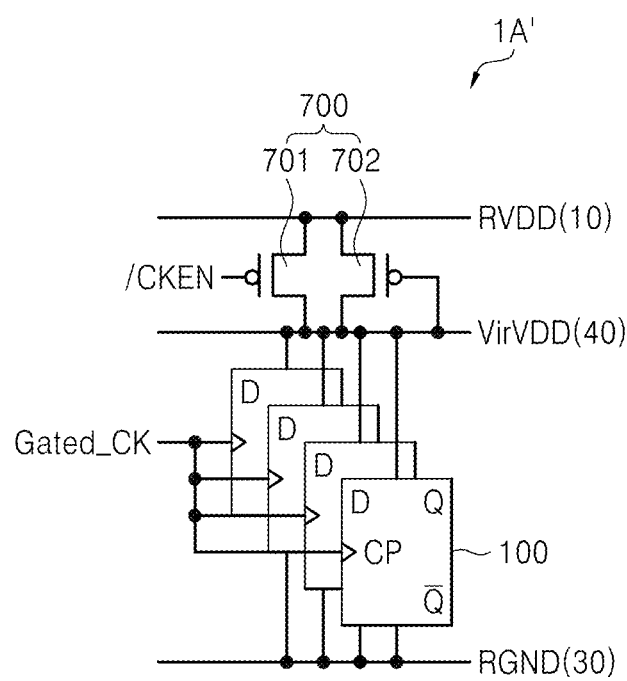
FIG. 2B is a block diagram of a power-gating circuit according to an example embodiment of inventive concepts.

FIG. 2B is a block diagram of a power-gating circuit 1A' according to another example embodiment of inventive concepts. Referring to FIG. 2B, the power-gating circuit 1A' also includes at least one flip-flop 100 and a switch circuit 700.

While the switch circuit 200 in the power-gating circuit 1A illustrated in FIG. 2A is connected between the first power supply voltage VirGND and the second power supply voltage RGND, the switch circuit 700 in the power-gating circuit 1A' illustrated in FIG. 2B is connected between the third power supply voltage RVDD and a fourth power supply voltage VirVDD. The first and second power supply voltages VirGND and RGND may be ground voltages and the third and fourth power supply voltages RVDD and VirVDD may be supply voltages.

The switch circuit 700 includes switches 701 and 702. The switch 701 is connected between the third power supply voltage RVDD and the fourth power supply voltage VirVDD and it operates in response to an inverted clock enable signal /CKEN. The switch 702 is connected between the third power supply voltage RVDD and the fourth power supply voltage VirVDD and it operates in response to the fourth power supply voltage VirVDD. The switches 701 and 702 may each be implemented as a P-channel metal oxide semiconductor (PMOS) transistor.

The switch 702 may be implemented as a diode-connected PMOS transistor. In other words, the PMOS transistor forming the switch 702 may have a diode connection in which a gate and a drain are connected with each other. A level difference between the third power supply voltage RVDD and the fourth power supply voltage VirVDD in the data hold mode may be a threshold voltage $V_{p\_th}$ of the PMOS transistor.

Figure 3:
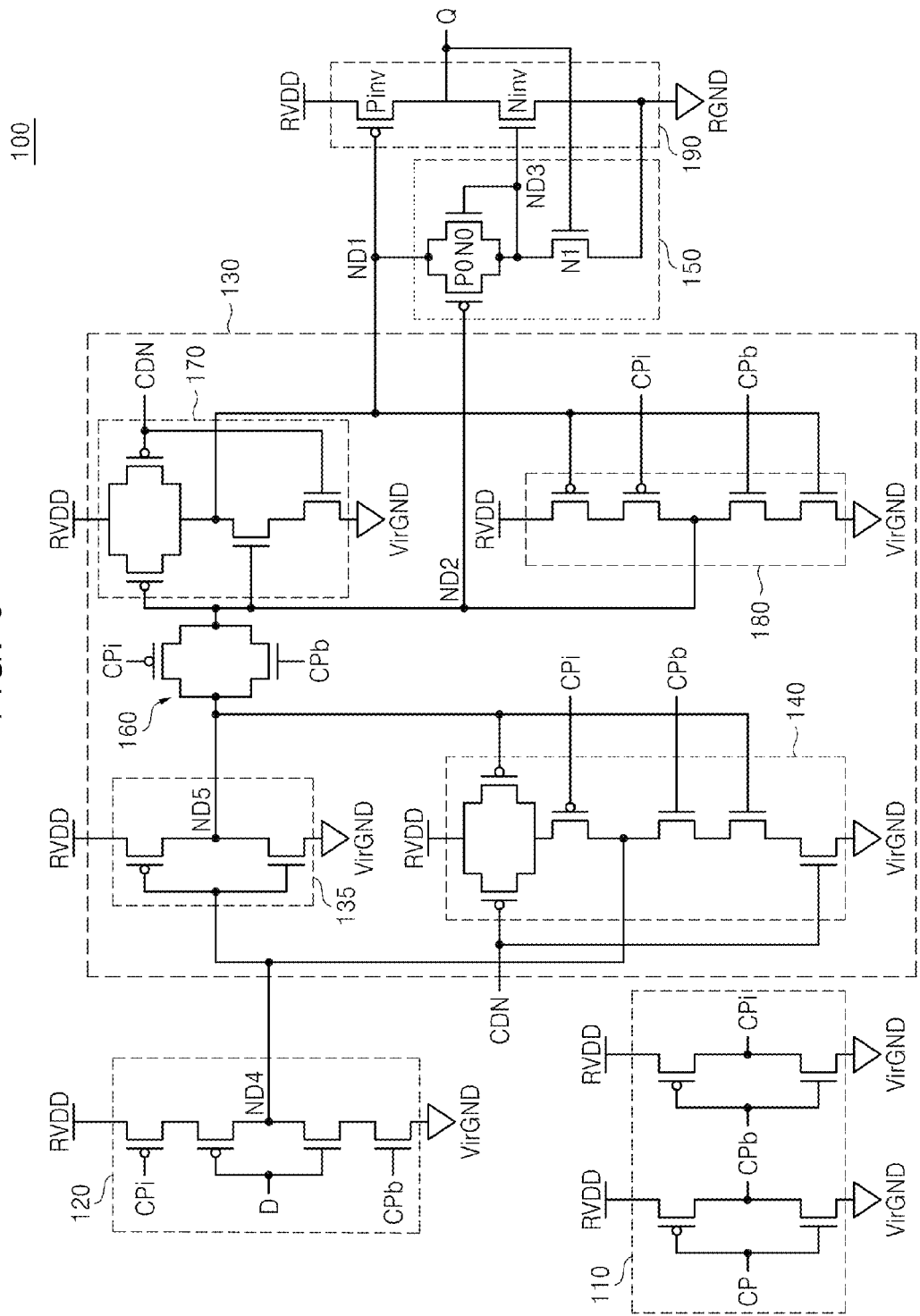
FIG. 3 is a circuit diagram of a flip-flop illustrated in FIG. 2A.

FIG. 3 is a circuit diagram of the flip-flop 100 illustrated in FIG. 2A. Referring to FIG. 3, the flip-flop 100 includes an internal clock signal generator 110, an input unit 120, a latch unit 130, a feedback circuit 150, and an output unit 190.

The internal clock signal generator 110 receives an input clock signal through the clock terminal CP, generates an inverted clock signal CPb by inverting the input clock signal, and generates an internal clock signal CPi by inverting the inverted clock signal CPb. The input clock signal received through the clock terminal CP may be the gated clock signal Gated_CK.

The input unit 120 may be implemented as an inverter that inverts and outputs the input signal D in response to the internal clock signal CPi and the inverted clock signal CPb.

The latch unit 130 includes a first latch (135, 140), a switch 160, and a second latch (170, 180). The first latch (135, 140) includes a first inverter 135 connected to an output node ND4 of the input unit 120 and a second inverter 140 connected to an output node ND5 of the inverter 135. An output node of the second inverter 140 is connected to an input node of the first inverter 135, i.e., the output node N4 of the input unit 120, thereby forming the first latch (135, 140).

The second inverter 140 includes transistors operating in response to a reset signal CDN, the inverted clock signal CPb, and the internal clock signal CPi, respectively, thereby operating in response to the reset signal CDN, the inverted clock signal CPb, and the internal clock signal CPi.

The reset signal CDN may be generated by a reset circuit 105 externally input to the flip-flop 100 to reset the flip-flop 100. For instance, when the reset signal CDN is enabled to a first logic level (e.g., "0"), the second inverter 140 outputs a high-level signal (e.g., RVDD), and therefore, an output signal of the first latch (135, 140), i.e., a signal of the node ND5 is at a low level.

The switch 160 transmits the output signal of the first latch (135, 140) to the second latch (170, 180) in response to the inverted clock signal CPb and the internal clock signal CPi. For instance, the switch 160 may be turned on when the inverted clock signal CPb is at a second logic level (e.g., "1") so that the output signal of the first latch (135, 140) is transmitted to the second latch (170, 180) and may be turned off when the inverted clock signal CPb is at a first logic level (e.g., "0") so that the output signal of the first latch (135, 140) is prevented from being transmitted to the second latch (170, 180).

The second latch (170, 180) includes a third inverter 170 and a fourth inverter 180 connected to an output node ND1 of the third inverter 170. An output node ND2 of the fourth inverter 180 is connected to an input node of the third inverter 170, thereby forming the second latch (170, 180).

The third inverter 170 operates in response to the reset signal CDN. For instance, when the reset signal CDN is enabled to the first logic level (e.g., "0"), the third inverter 170 outputs a high-level signal (e.g., RVDD), and therefore, the output signal Q of the flip-flop 100 is reset to a low level. The fourth inverter 180 operates in response to the inverted clock signal CPb and the internal clock signal CPi.

The output unit 190 inverts an output signal of the second latch (170, 180), i.e., a signal of the first node ND1 to output the output signal Q of the flip-flop 100. While the internal clock signal generator 110, the input unit 120, and the latch unit 130 use the first power supply voltage VirGND and the third power supply voltage RVDD as operating voltages, the output unit 190 uses the second power supply voltage RGND and the third power supply voltage RVDD as operating voltages.

The output unit 190 includes a first drive transistor Pinv connected between the third power supply voltage RVDD and a node for the output signal Q and a second drive transistor Ninv connected between the node for the output signal Q and the second power supply voltage RGND. The first drive transistor Pinv may be a PMOS transistor and the second drive transistor Ninv may be an NMOS transistor.

The first drive transistor Pinv drives the output signal Q to the level of the third power supply voltage RVDD in response to the output signal of the second latch, i.e., the signal of the node ND1. The second drive transistor Ninv drives the output signal Q to the level of the second power supply voltage RGND in response to the signal of the node ND3.

The feedback circuit 150 includes a PMOS transistor P0 and an NMOS transistor N0, which are connected in parallel between the gates ND1 and ND3 of the respective drive transistors Pinv and Ninv of the output unit 190, and an NMOS transistor N1 connected between the gate ND3 of the second drive transistor Ninv of the output unit 190 and the second power supply voltage RGND.

When the gate voltage of the first drive transistor Pinv of the output unit 190 is at the level of the NMOS transistor threshold voltage Vn_th, i.e., the first power supply voltage VirGND, the first drive transistor Pinv is turned on and the output signal Q is driven to the level of the third power supply voltage RVDD. Accordingly, the PMOS transistor P0 and the NMOS transistor N0 in the feedback circuit 150 are turned off and the NMOS transistor N1 is fully turned on. As a result, the gate voltage of the second drive transistor Ninv of the output unit 190 is at the level of the second power supply voltage RGND (e.g., 0 V).

When the gate voltage of the first drive transistor Pinv of the output unit 190 is at the level of the third power supply voltage RVDD, the gate voltage of the PMOS transistor P0 of the feedback circuit 150 is at a low level, and therefore, the PMOS transistor P0 is turned on. Accordingly, the gate voltage of the NMOS transistor N0 of the feedback circuit 150 is at a high level and the second drive transistor Ninv of the output unit 190 is turned on. As a result, the output signal Q is driven to the level of the second power supply voltage RGND and the NMOS transistor N1 is turned off.

The flip-flop 100 illustrated in FIG. 2B may be similar to or may be partly different in structure than that illustrated in FIG. 2A. In particular, the feedback circuit 150 may be modified to be suitable for the flip-flop 100 illustrated in FIG. 2B. For instance, nodes connected to the transistors included in the feedback circuit 150 may be changed.

Figure 4A:
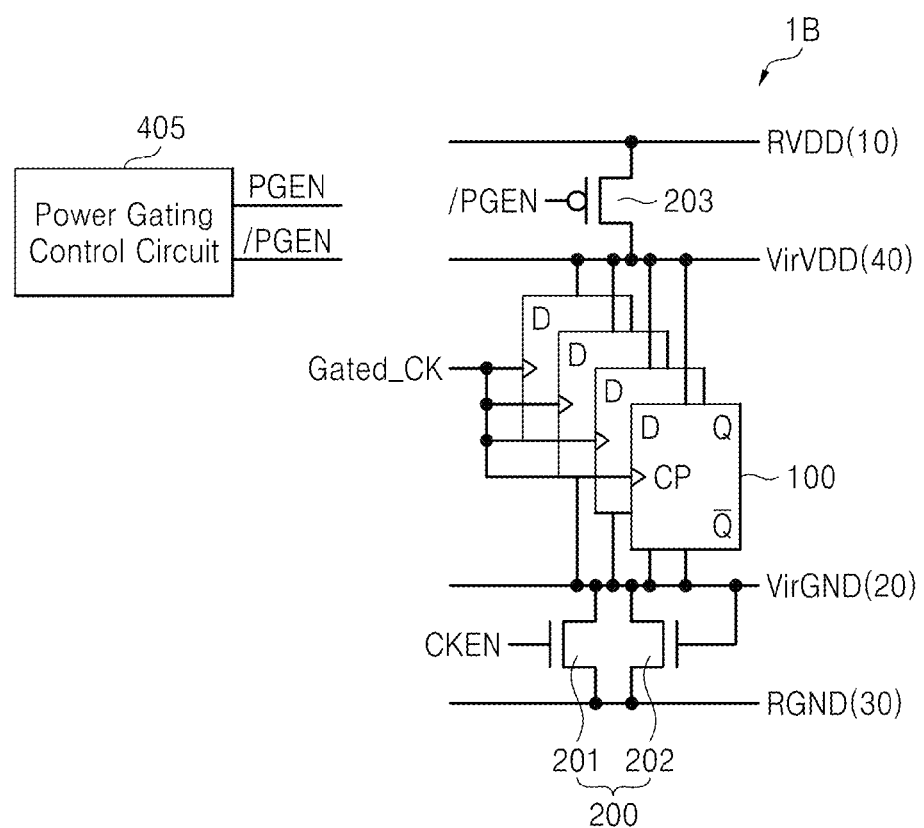
FIG. 4A is a block diagram of a power-gating circuit according to an example embodiment of inventive concepts.

FIG. 4A is a block diagram of a power-gating circuit 1B according to another example embodiment of inventive concepts. Referring to FIG. 4A, the power-gating circuit 1B further includes a third switch 203 as compared to the power-gating circuit 1A illustrated in FIG. 2A. Accordingly, the flip-flop 100 illustrated in FIG. 4A receives the fourth power supply voltage VirVDD instead of the third power supply voltage RVDD as a supply voltage.

The third switch 203 is connected between the third power supply voltage RVDD and the fourth power supply voltage VirVDD and it operates in response to a power gating enable signal PGEN from a power gating control circuit 405. For instance, the third switch 203 is turned on while the power gating enable signal PGEN is at a high level, so that the fourth power supply voltage VirVDD may be at substantially the same level as the third power supply voltage RVDD.

The structure and functions of the flip-flop 100 and the switch circuit 200 illustrated in FIG. 4A are substantially the same as those of the flip-flop 100 and the switch circuit 200 illustrated in FIG. 1.

Figure 4B:
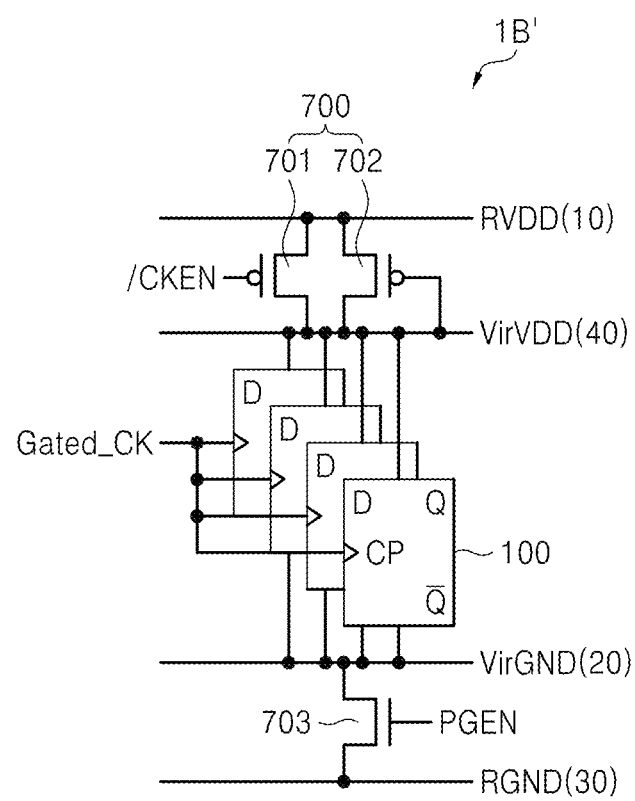
FIG. 4B is a block diagram of a power-gating circuit according to an example embodiment of inventive concepts.

FIG. 4B is a block diagram of a power-gating circuit 1B' according to another example embodiment of inventive concepts. Referring to FIG. 4B, the power-gating circuit 1B' further includes a switch 703 as compared to the power-gating circuit 1A' illustrated in FIG. 2B.

The switch 703 is connected between the first power supply voltage VirGND and the second power supply voltage RGND and it operates in response to the power gating enable signal PGEN. For instance, the switch 703 is turned on while the power gating enable signal PGEN is at the high level, so that the first power supply voltage VirGND may be at substantially the same level as the second power supply voltage RGND.

Figure 5A:
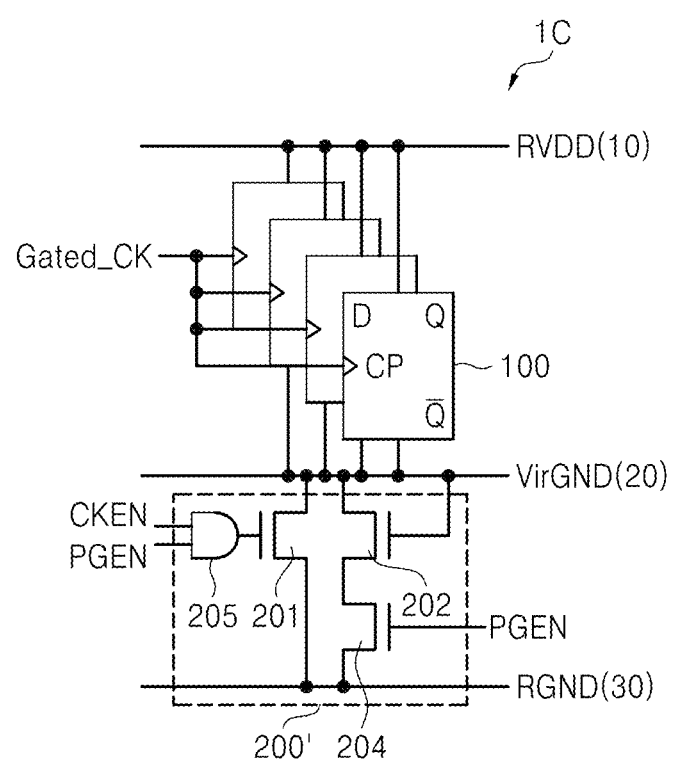
FIG. 5A is a block diagram of a power-gating circuit according to an example embodiment of inventive concepts.

FIG. 5A is a block diagram of a power-gating circuit 1C according to another example embodiment of inventive concepts. Referring to FIG. 5A, the power-gating circuit 1C includes at least one flip-flop 100 and a switch circuit 200'.

The structure and functions of the flip-flop 100 illustrated in FIG. 5A are substantially the same as those of the flip-flop 100 illustrated in FIGS. 2A and 3. The switch circuit 200' includes the first switch 201, the second switch 202, a fourth switch 204, and a logical operation element 205. The first switch is connected between the first power supply voltage VirGND and the second power supply voltage RGND and it operates in response to an output signal of the logical operation element 205. The logical operation element 205 may be implemented as an AND gate that performs an AND operation on the clock enable signal CKEN and the power gating enable signal PGEN. However, the logical operation element 205 may be implemented as a different logical operation element such as a NAND gate.

The second switch 202 and the fourth switch 204 are connected in series between the first power supply voltage VirGND and the second power supply voltage RGND. The second switch 202 operates in response to the first power supply voltage VirGND and the fourth switch 204 operates in response to the power gating enable signal PGEN.

The embodiments illustrated in FIG. 5A are different from those illustrated in FIG. 2A in that the first switch 201 also operates in response to the power gating enable signal PGEN and the second switch 202 is connected to the second power supply voltage RGND through the fourth switch 204 operating in response to the power gating enable signal PGEN.

Figure 5B:
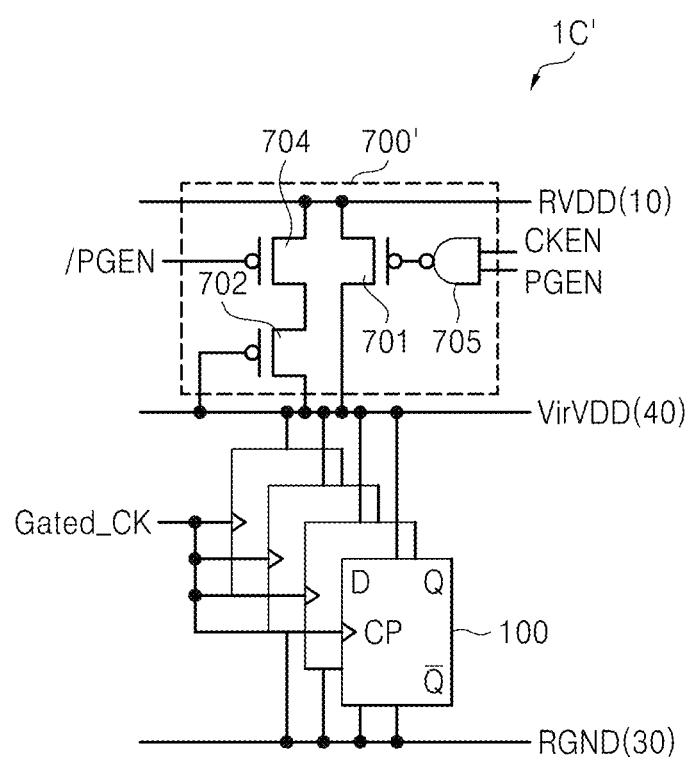
FIG. 5B is a block diagram of a power-gating circuit according to an example embodiment of inventive concepts.

FIG. 5B is a block diagram of a power-gating circuit 1C' according to an example embodiment of inventive concepts. Referring to FIG. 5B, the power-gating circuit 1C' includes at least one flip-flop 100 and a switch circuit 700'.

The switch circuit 700' includes the first switch 701, the second switch 702, a fourth switch 704, and a logical operation element 705. The first switch 701 is connected between the third power supply voltage RVDD and the fourth power supply voltage VirVDD and it operates in response to an output signal of the logical operation element 705. The logical operation element 705 may be implemented as a NAND gate that performs a NAND operation on the clock enable signal CKEN and the power gating enable signal PGEN, but the inventive concept is not restricted thereto.

The second switch 702 and the fourth switch 704 are connected in series between the fourth power supply voltage VirVDD and the third power supply voltage RVDD. The second switch 702 operates in response to the fourth power supply voltage VirVDD and the fourth switch 704 operates in response to an inverted power gating enable signal /PGEN.

The power-gating circuits 1B, 1B', 1C, and 1C' illustrated in FIGS. 4A, 4B, 5A, and 5B, respectively, perform both clock gating and power gating. Accordingly, the flip-flop 100 illustrated in FIGS. 4A through 5B may operate in three kinds of mode, e.g., an active mode, a data hold mode, and a standby mode.

In the active mode, both of the power gating enable signal PGEN and the clock enable signal CKEN are enabled (e.g., PGEN=1 and CKEN=1). Accordingly, the flip-flop 100 receives the third power supply voltage RVDD as the supply voltage and the second power supply voltage RGND as the ground voltage.

In the data hold mode, the power gating enable signal PGEN is enabled and the clock enable signal CKEN is disabled (e.g., PGEN=1 and CKEN=0). Since the clock signal CK is masked in the data hold mode, the flip-flop 100 retains data using operating voltages, e.g., RVDD and VirGND or VirVDD or RGND, lower than the operating voltages RVDD and RGND used in the active mode. Accordingly, the leakage current in the flip-flop 100 is reduced as compared to the active mode. As a result, power consumption is also decreased.

In the standby mode, the power gating enable signal PGEN is disabled (e.g., PGEN=0). In the standby mode, a current path from the supply voltage to the ground voltage is not formed.

Figure 6:
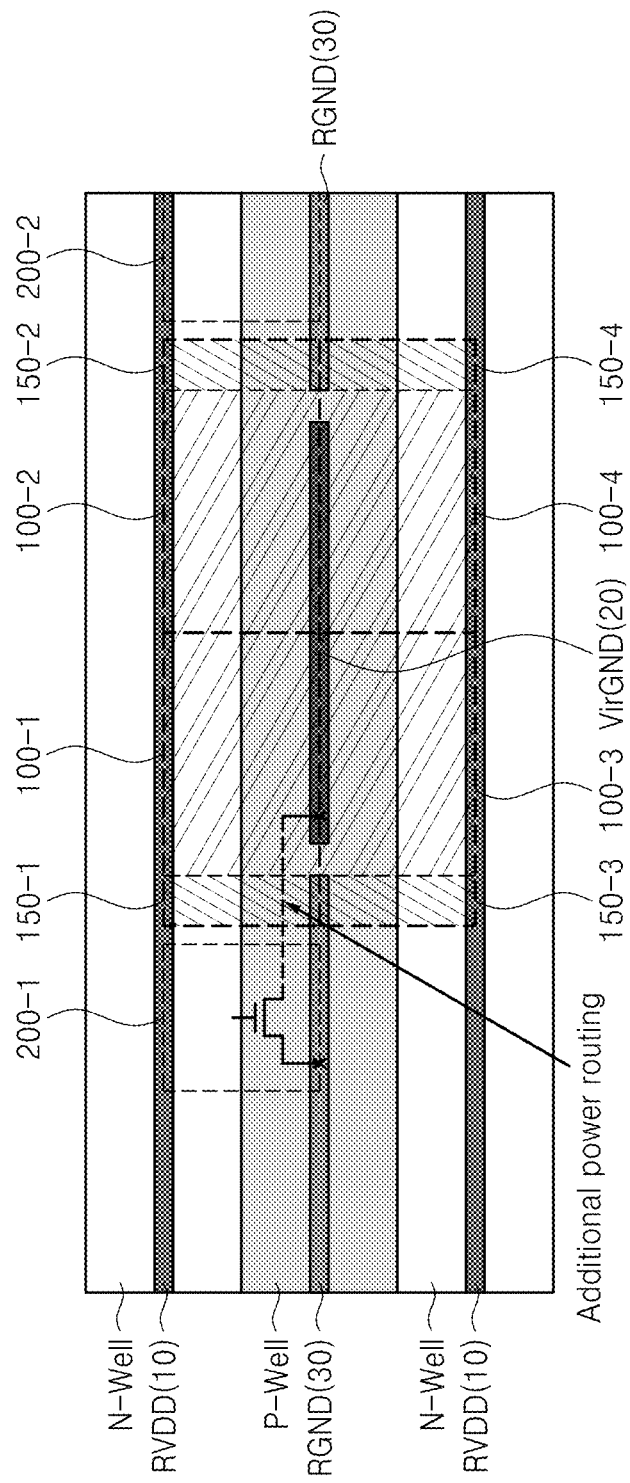
FIG. 6 is a diagram of a power-gating circuit layout according to an example embodiment of inventive concepts.

FIG. 6 is a diagram of a power-gating circuit layout according to an example embodiment of inventive concepts. For instance, the power-gating circuit 1A illustrated in FIG. 2A may be implemented using the layout illustrated in FIG. 6.

Referring to FIG. 6, a first metal line 20 for applying the first power supply voltage VirGND and a second metal line 30 for applying the second power supply voltage RGND are placed on a straight line to be separated from each other. A third metal line 10 for applying the third power supply voltage RVDD may be placed at each side of the straight line including the first metal line 20 and the second metal line 30 in parallel to the straight line. Reference numerals 100-1 through 100-4 denote regions in which the flip-flop 100 is placed. A standardized flip-flop (hereinafter, referred to as a flip-flop cell) is placed in each of the regions 100-1 through 100-4, so that an entire region including all regions 100-1 through 100-4 may be a region for a 4-bit flip-flop. Reference numerals 150-1 through 150-4 may denote regions in which the feedback circuit 150 of the flip-flop 100 illustrated in FIG. 3 is placed or in which the feedback circuit 150 and the output unit 190 of the flip-flop 100 illustrated in FIG. 3 are placed. Since the feedback circuit 150 and the output unit 190 of the flip-flop 100 are connected to the second power supply voltage RGND, the regions 150-1 through 150-4 may be disposed to be close to the second metal line 30.

Reference numeral 200-1 denotes a region in which the first switch 201 is placed. A drain of the first switch 201 is connected to the first metal line 20 through additional power routing, a source thereof is formed to be connected to the second metal line 30, and a gate thereof is routed so that the clock enable signal CKEN is applied to the gate. Reference numeral 200-2 may denote a region in which the second switch 202 is placed.

A circuit whose layout is specified and standardized to a select size (e.g., a size allowing the circuit to be placed between the second metal line 30 and the third metal line 10) and which is implemented to perform a particular function is referred to as a standard cell. A flip-flop (e.g., 100-1) may be implemented as a flip-flop cell, i.e., a standard cell having a standardized layout as described above. Similarly, the layouts 200-1 and 200-2 of the first and second switches 201 and 202, respectively, may also implemented as standard cells (hereinafter, referred to as switch cells). In this case, a flip-flop cell is placed in a normal direction in each of the regions 100-1 and 100-2 while a flip-flop cell may be placed in a mirror image of the normal direction in each of the regions 100-3 and 100-4. At least two flip-flop cells (e.g., 100-1 through 100-4) may be together treated as a single standard cell.

In an example embodiment, four flip-flops (respectively placed in the regions 100-1 through 100-4, forming a 4-bit flip-flop) share one first switch 200-1 and one second switch 200-2 with one another. Although the first metal line 20 and the second metal line 30 are placed on the straight line in the embodiments illustrated in FIG. 6, they may be placed in parallel to each other.

In another example embodiment, the third metal line 10 for applying the third power supply voltage RVDD and a fourth metal line 40 for applying the fourth power supply voltage VirVDD may be placed on a straight line to be separated from each other. In addition, the second metal line 30 for applying the second power supply voltage RGND may be placed at each side of the straight line including the third metal line 10 and the fourth metal line 40 in parallel to the straight line.

Figure 7A:
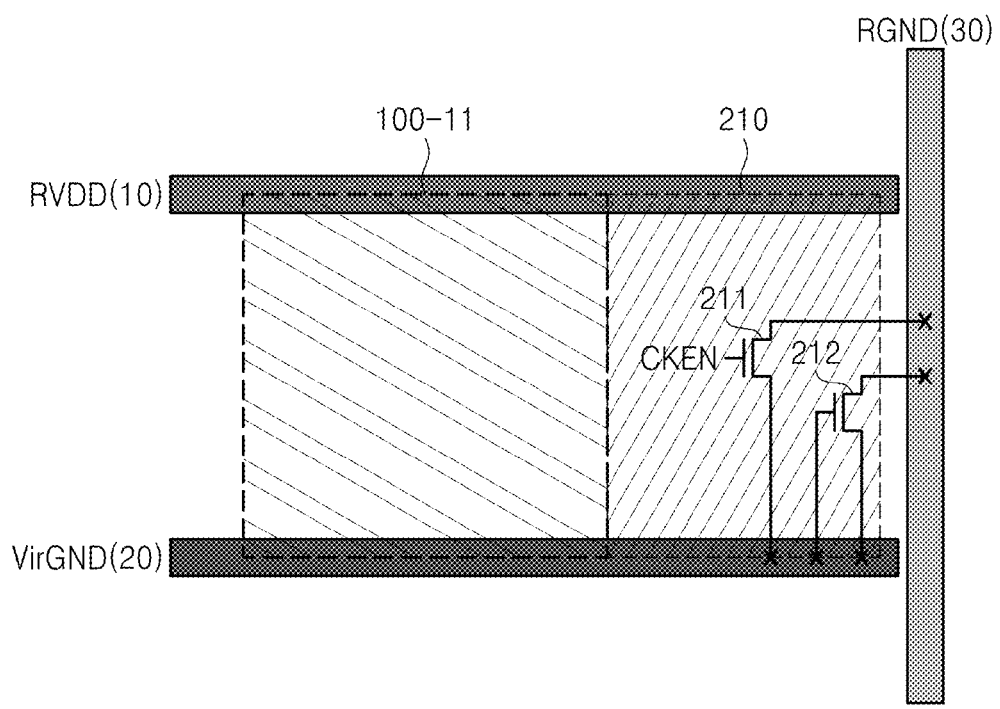
FIG. 7A is a diagram of a power-gating circuit layout according to an example embodiment of inventive concepts.

FIG. 7A is a diagram of a power-gating circuit layout according to another example embodiment of inventive concepts. For instance, the power-gating circuit 1A illustrated in FIG. 2A may be implemented using the layout illustrated in FIG. 7A.

Referring to FIG. 7A, the first metal line 20 for applying the first power supply voltage VirGND and the third metal line 10 for applying the third power supply voltage RVDD may be placed in parallel to each other. Contrarily, the second metal line 30 for applying the second power supply voltage RGND may be placed perpendicular to the first metal line 20 and the third metal line 10. For instance, the first metal line 20 and the third metal line 10 may be placed long in an x-axis direction and the second metal line 30 may be placed long in a y-axis direction. At this time, the first metal line 20 and the third metal line 10 may be placed on one layer while the second metal line 30 may be placed on another layer.

Reference numeral 100-11 denotes a region in which the flip-flop 100 is placed. The above-described flip-flop cell may be used. Reference numeral 210 denotes a region in which first and second switches 211 and 212 are placed. The first and second switches 211 and 212 may be implemented together in a single standard cell (e.g., a switch cell). The first and second switches 211 and 212 correspond to the first and second switches 201 and 202, respectively, illustrated in FIGS. 1 through 5.

Figure 7B:
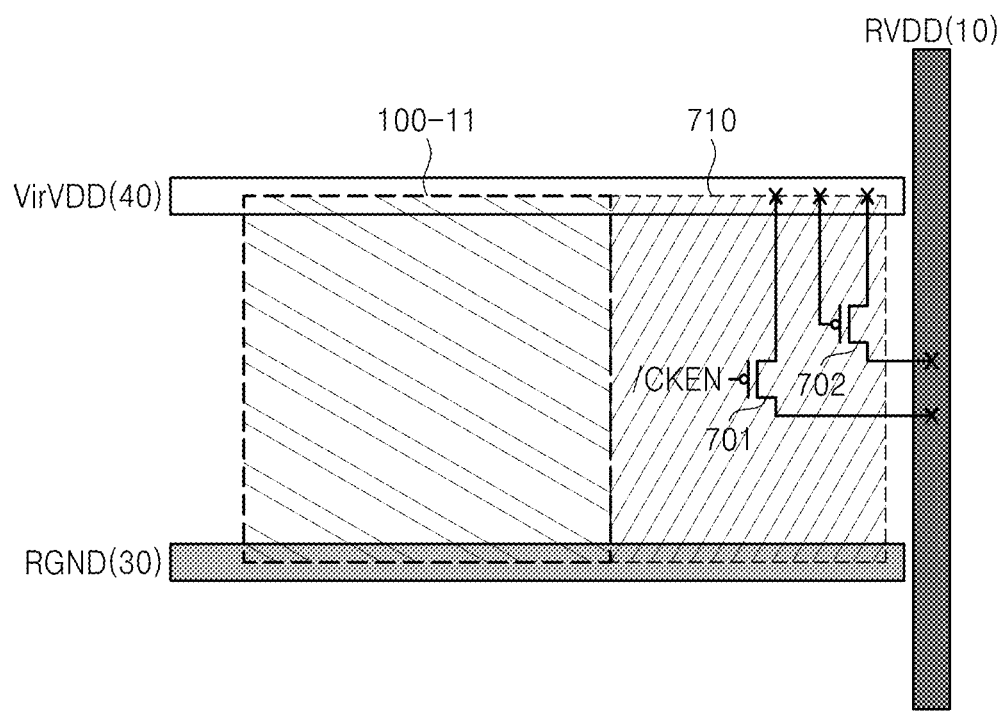
FIG. 7B is a diagram of a power-gating circuit layout according to an example embodiment of inventive concepts.

FIG. 7B is a diagram of a power-gating circuit layout according to another example embodiment of inventive concepts. For instance, the power-gating circuit 1A' illustrated in FIG. 2B may be implemented using the layout illustrated in FIG. 7B.

Referring to FIG. 7B, the fourth metal line 40 for applying the fourth power supply voltage VirVDD and the second metal line 30 for applying the second power supply voltage RGND may be placed in parallel to each other. Contrarily, the third metal line 10 for applying the third power supply voltage RVDD may be placed perpendicular to the fourth metal line 40 and the second metal line 30. For instance, the fourth metal line 40 and the second metal line 30 may be placed long in the x-axis direction and the third metal line 10 may be placed long in the y-axis direction.

Reference numeral 100-11 denotes a region in which the flip-flop 100 is placed. The above-described flip-flop cell may be used. Reference numeral 710 denotes a region in which the switches 701 and 702 are placed. The switches 701 and 702 may be implemented together in a single standard cell (e.g., a switch cell).

Figure 8A:
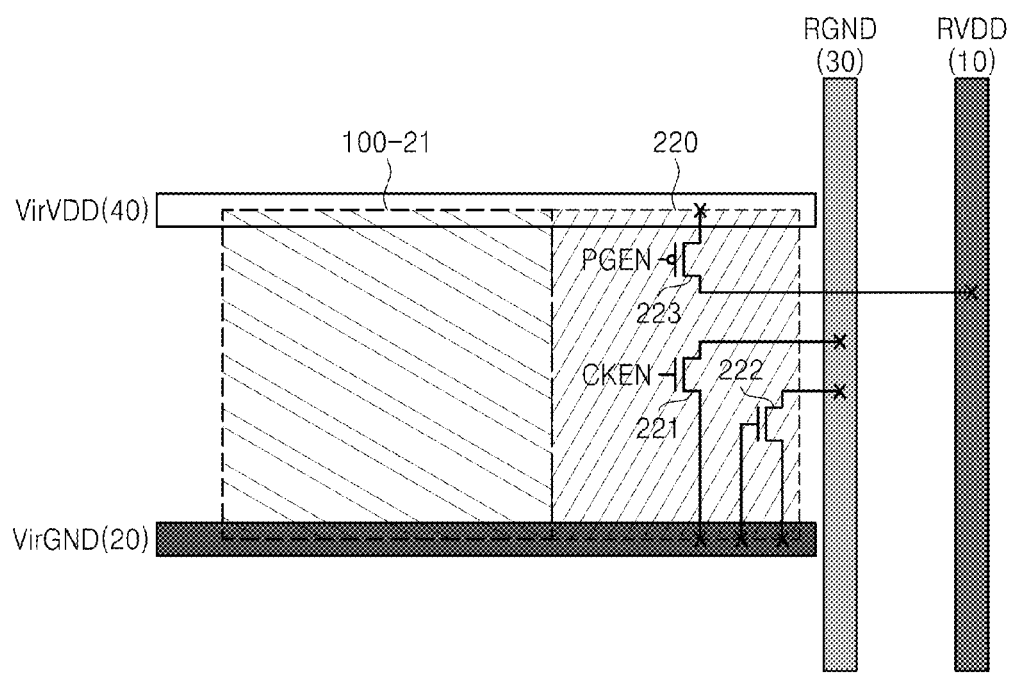
FIG. 8A is a diagram of a power-gating circuit layout according to an example embodiment of inventive concepts.

FIG. 8A is a diagram of a power-gating circuit layout according to another example embodiment of inventive concepts. For instance, the power-gating circuit 1B illustrated in FIG. 4A may be implemented using the layout illustrated in FIG. 8A.

Referring to FIG. 8A, the first metal line 20 for applying the first power supply voltage VirGND and the fourth metal line 40 for applying the fourth power supply voltage VirVDD may be placed in parallel to each other. Contrarily, the second metal line 30 for applying the second power supply voltage RGND and the second metal line 30 for applying the third power supply voltage RVDD may be placed to be perpendicular to the first metal line 20 and the fourth metal line 40 and to be parallel to each other. For instance, the first metal line 20 and the fourth metal line 40 may be placed long in the x-axis direction and the second metal line 30 and the third metal line 10 may be placed long in the y-axis direction. At this time, the first metal line 20 and the fourth metal line 40 may be placed on one layer while the second metal line 30 and the third metal line 10 may be placed on a layer different than the first metal line 20 and the fourth metal line 40.

Reference numeral 100-21 denotes a region in which the flip-flop 100 is placed. The above-described flip-flop cell may be used. Reference numeral 220 denotes a region in which first through third switches 221, 222, and 223 are placed. The first through third switches 221, 222, and 223 may be implemented together in a single standard cell. The first through third switches 221, 222, and 223 correspond to the first through third switches 201 through 203, respectively, illustrated in FIG. 4A.

Figure 8B:
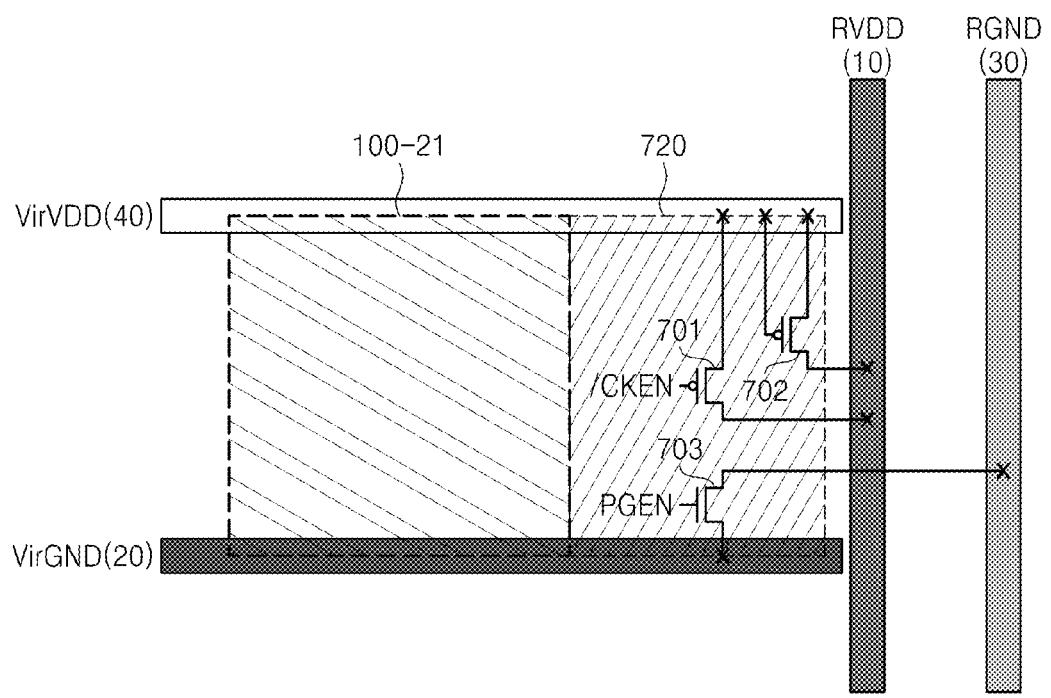
FIG. 8B is a diagram of a power-gating circuit layout according to an example embodiment of inventive concepts.

FIG. 8B is a diagram of a power-gating circuit layout according to another example embodiment of inventive concepts. For instance, the power-gating circuit 1B' illustrated in FIG. 4B may be implemented using the layout illustrated in FIG. 8B.

Referring to FIG. 8B, the first metal line 20 for applying the first power supply voltage VirGND and the fourth metal line 40 for applying the fourth power supply voltage VirVDD may be placed in parallel to each other. Contrarily, the second metal line 30 for applying the second power supply voltage RGND and the second metal line 30 for applying the third power supply voltage RVDD may be placed to be perpendicular to the first metal line 20 and the fourth metal line 40 and to be parallel to each other. For instance, the first metal line 20 and the fourth metal line 40 may be placed long in the x-axis direction and the second metal line 30 and the third metal line 10 may be placed long in the y-axis direction. At this time, the first metal line 20 and the fourth metal line 40 may be placed on one layer while the second metal line 30 and the third metal line 10 may be placed on a layer different than the first metal line 20 and the fourth metal line 40.

Reference numeral 100-21 denotes a region in which the flip-flop 100 is placed. The above-described flip-flop cell may be used. Reference numeral 720 denotes a region in which the first through third switches 701, 702, and 703 are placed. The first through third switches 701 through 703 may be implemented together in a single standard cell.

Figure 9A:
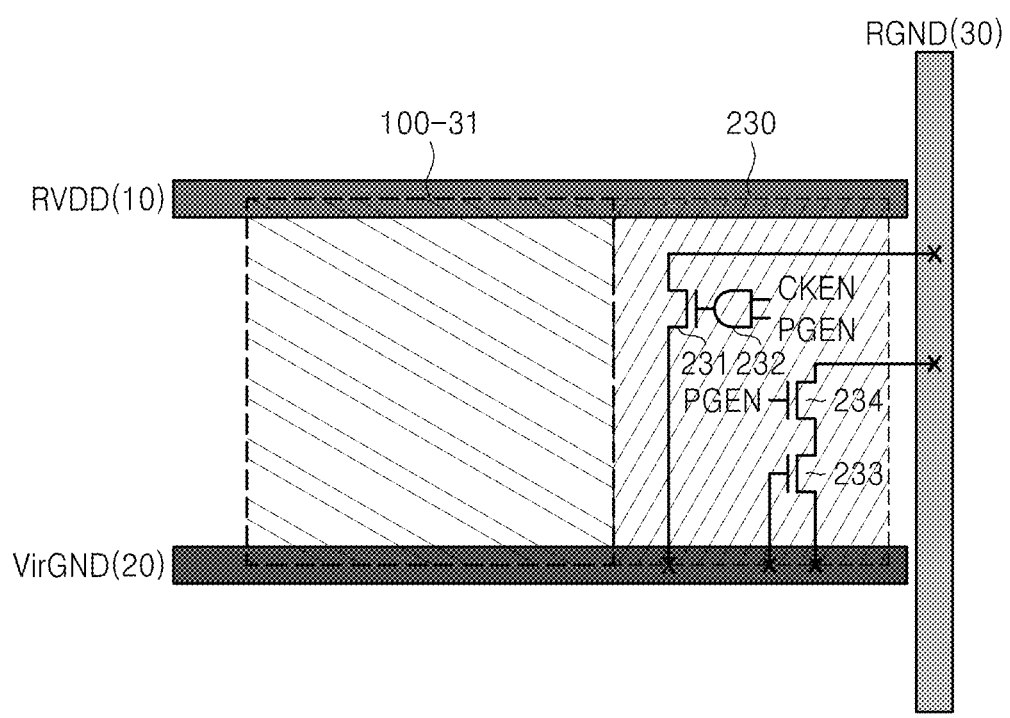
FIG. 9A is a diagram of a power-gating circuit layout according to an example embodiment of inventive concepts.

FIG. 9A is a diagram of a power-gating circuit layout according to another example embodiment of inventive concepts. For instance, the power-gating circuit 1C illustrated in FIG. 5A may be implemented using the layout illustrated in FIG. 9A.

Referring to FIG. 9A, the first metal line 20 for applying the first power supply voltage VirGND and the third metal line 10 for applying the third power supply voltage RVDD may be placed in parallel to each other. Contrarily, the second metal line 30 for applying the second power supply voltage RGND may be placed perpendicular to the first metal line 20 and the third metal line 10. For instance, the first metal line 20 and the third metal line 10 may be placed long in the x-axis direction and the second metal line 30 may be placed long in the y-axis direction. At this time, the first metal line 20 and the third metal line 10 may be placed on one layer while the second metal line 30 may be placed on another layer.

Reference numeral 100-31 denotes a region in which the flip-flop 100 is placed. The above-described flip-flop cell may be used. Reference numeral 230 denotes a region in which the switch circuit 200' illustrated in FIG. 5A is placed.

For the switch circuit 200', the first, second and fourth switches 231, 233, and 234 and the logical operation element 232 may be implemented together in a single standard cell 230. The standard cell 230 realizing the switch circuit 200' may be placed between the first metal line 20 and the third metal line 10.

Figure 9B:
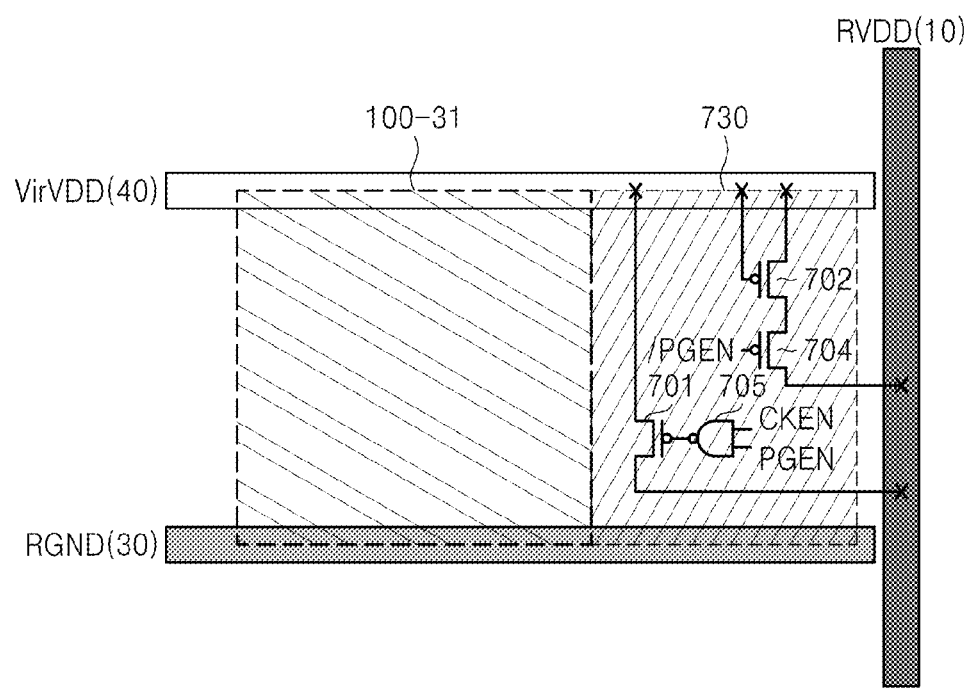
FIG. 9B is a diagram of a power-gating circuit layout according to an example embodiment of inventive concepts.

FIG. 9B is a diagram of a power-gating circuit layout according to another example embodiment of inventive concepts. For instance, the power-gating circuit 1C' illustrated in FIG. 5B may be implemented using the layout illustrated in FIG. 9B.

Referring to FIG. 9B, the fourth metal line 40 for applying the fourth power supply voltage VirVDD and the second metal line 30 for applying the second power supply voltage RGND may be placed in parallel to each other. Contrarily, the third metal line 10 for applying the third power supply voltage RVDD may be placed perpendicular to the fourth metal line 40 and the second metal line 30.

Reference numeral 100-31 denotes a region in which the flip-flop 100 is placed. The above-described flip-flop cell may be used. Reference numeral 730 denotes a region in which the switch circuit 700' illustrated in FIG. 5B is placed.

For the switch circuit 700', the first, second and fourth switches 701, 702, and 704 and the logical operation element 705 may be implemented together in a single standard cell 730. The standard cell 730 realizing the switch circuit 700' may be placed between the second metal line 30 and the fourth metal line 40.

Figure 10:
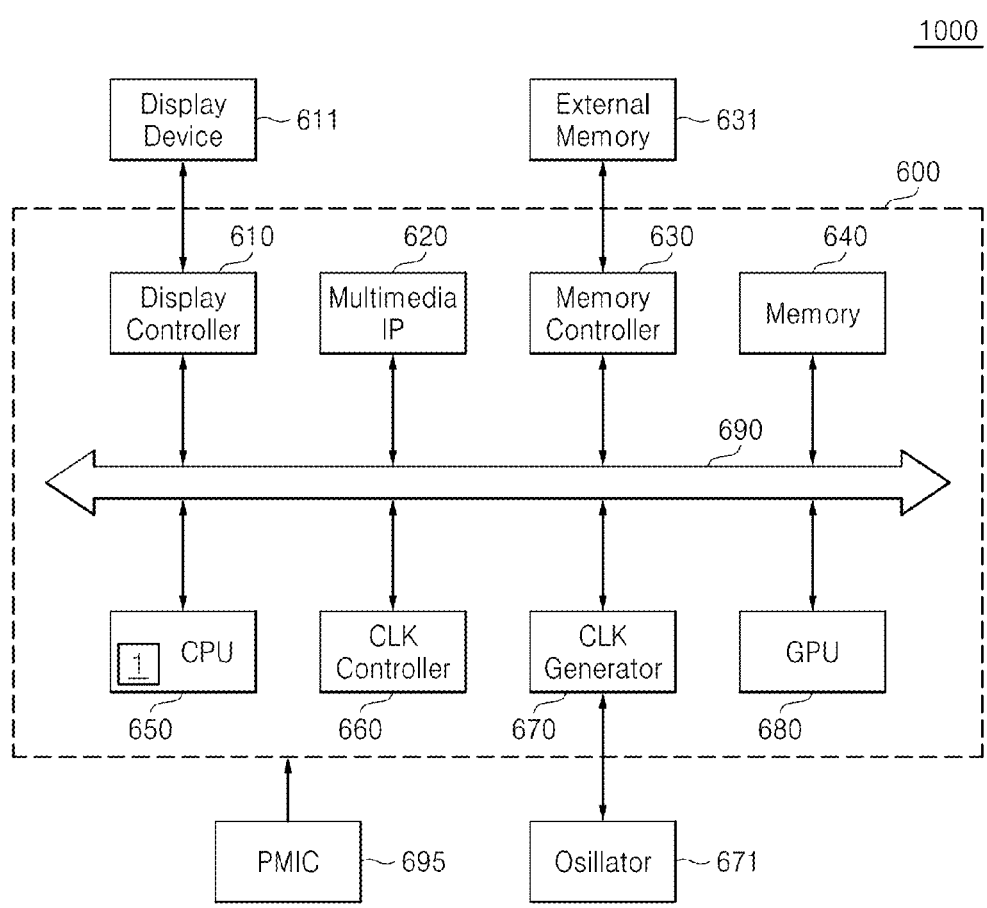
FIG. 10 is a block diagram of an electronic system according to an example embodiment of inventive concepts.

FIG. 10 is a block diagram of an electronic system 1000 according to another example embodiment of inventive concepts. Referring to FIG. 10, the electronic system 1000 may be implemented as a handheld device such as a mobile telephone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, or an e-book. The electronic system 1000 may include a system on chip (SoC) 600, an external memory 631, and a display device 611.

The SoC 600 may include a display controller 610, a multimedia processing module 620, a memory controller 630, a memory 640, a central processing unit (CPU) 650, a clock controller 660, a clock generator 670, a graphics processing unit (GPU) 680, and a bus 190. The SoC 600 may also include other elements apart from the above-mentioned elements. The electronic system 1000 may also include an oscillator 671 and a power management unit integrated circuit (PMIC) 695.

The memory 640 may include read-only memory (ROM) and/or random access memory. Although the PMIC 695 is provided outside the SoC 600 in the example embodiment illustrated in FIG. 10, the SoC 600 may include a power management unit (PMU) that can perform the functions of the PMIC 695 in other embodiments.

The CPU 650, which may be referred to as a processor, may process or execute programs and/or data stored in the external memory 631. For instance, the CPU 650 may process or execute the programs and/or the data in response to an operating clock signal output from the clock controller 660.

The CPU 650 may be implemented by a multi-core processor. The multi-core processor is a single computing component with two or more independent actual processors (referred to as cores). Each of the processors may read and execute program instructions. The CPU 650 may include a power-gating circuit according to an example embodiment of inventive concepts. The power-gating circuit may be one of the power-gating circuits 1 through 1C' respectively illustrated in FIGS. 1 through 5B.

Programs and/or data stored in the memory 640 and/or the external memory 631 may be loaded to a memory (not shown) of the CPU 650 when necessary.

The memory 640 may store permanent programs and/or data. The memory 640 may include erasable programmable ROM (EPROM) or electrically erasable programmable ROM (EEPROM). The memory 640 may temporarily store programs, data, or instructions. For instance, the programs and/or the data stored in the external memory 631 may be temporarily stored in the memory 640 according to the control of the CPU 650. The memory 640 may include dynamic RAM (DRAM) or static RAM (SRAM).

The GPU 680 may reduce the load of the CPU 650 and may also convert data read by the memory controller 630 from the external memory 631 into a signal suitable to the display device 611. Data processed by the GPU 680 may be stored in the external memory 631. For instance, the GPU 680 may process or execute the program and/or the data in response to an operating clock signal output from the clock controller 660.

The clock controller 660 generates an operating clock signal. The clock controller 660 may include a clock signal generator such as a phase locked loop (PLL), a delay locked loop (DLL), or a crystal oscillator. The operating clock signal may be applied to the GPU 680 and may also be applied to other elements (e.g., the CPU 650 and the memory controller 630). The clock controller 660 may change the frequency of the operating clock signal.

The memory controller 630 is used for the interface with the external memory 631. The memory controller 630 controls the overall operation of the external memory 631 and controls the data communication between a host and the external memory 631. For instance, the memory controller 630 may write data to or read data from the external memory 631 at the request of the host. The host may be a master device such as the CPU 650, the GPU 680, or the display controller 610.

The external memory 631 is a storage medium for storing data and it may store an operating system (OS) and various kinds of programs and data. The external memory 631 may be DRAM, but inventive concepts are not restricted thereto. The external memory 631 may be non-volatile memory such as flash memory, phase-change RAM (PRAM), magnetic RAM (MRAM), resistive RAM (ReRAM) or ferroelectric RAM (FeRAM). In other embodiments, the external memory 631 may be an embedded memory placed within the SoC 600. The external memory 631 may also be flash memory, an embedded multimedia card (eMMC), or a universal flash storage (UFS).

The elements 610, 620, 630, 640, 650, 660, 670, and 680 may communicate with one another through the bus 190.

The display device 611 may display image signals output from the display controller 610. The display device 611 may be implemented as a liquid crystal display (LCD) device, a light emitting diode (LED) display device, an organic LED (OLED) display device, an active-matrix OLED (AMOLED) display device, or a flexible display device. The display controller 610 controls the operations of the display device 611.

The multimedia processing module 620 is a functional block for processing multimedia data. The multimedia processing module 620 may include an image codec that can code and decode image data.

As described above, according to example embodiments of inventive concepts, the operating voltage of the flip-flop 100 is reduced while the clock enable signal CKEN is being disabled and a clock signal applied to the flip-flop 100 is being masked, so that leakage current and power consumption of the flip-flop 100 are reduced.

While inventive concepts have been particularly shown and described with reference to example embodiments thereof, it will be understood by those of ordinary skill in the art that various changes in forms and details may be made therein without departing from the spirit and scope of inventive concepts as defined by the following claims.

What is claimed is:

1. A power circuit comprising:
   at least one flip-flop configured to operate based on an operating mode of the power circuit, the operating mode being one of a first mode and a second mode;
   a switch circuit selectively coupled between a first power supply voltage source and a second power supply voltage source, the first power supply voltage source configured to supply a first power supply voltage and the second power supply voltage source configured to supply a second power supply voltage, the switch circuit configured to supply one of the first and second power supply voltages to the at least one flip-flop based on the operating mode, the switch circuit including at least a first switch having a threshold voltage and a difference between the first and second power supply voltages is the threshold voltage; and
   a clock gating circuit configured to generate a gated clock signal based on a clock enable signal, wherein
   the at least one flip-flop is configured to receive the gated clock signal and operate based on the gated clock signal, and
   the switch circuit is configured to receive the clock enable signal and selectively couple the first power supply voltage source and the second power supply voltage source based on the clock enable signal.

2. The power circuit of claim 1, further comprising:
   a logic circuit configured to generate the clock enable signal, the clock enable signal having a high level in the first mode and a low level in the second mode, the first mode being an active mode and the second mode being a data hold mode.

3. The power circuit of claim 1, wherein the first switch is an NMOS transistor.

4. A power-gating circuit comprising:
   a flip-flop configured to receive a first power supply voltage and a gated clock signal;
   a logic circuit configured to output an input signal of the flip-flop and to generate a clock enable signal; and
   a switch circuit configured to receive a first power supply voltage and a second power supply voltage, the switch circuit including a first switch and a second switch,
   wherein the first switch is configured to receive the first power supply voltage and the second power supply voltage, and the first switch is configured to operate in response to the clock enable signal, and the second switch is configured to receive the first power supply voltage and the second power supply voltage, and the second switch is configured to operate in response to the first power supply voltage.

5. The power-gating circuit of claim 4, further comprising:
a clock gating circuit configured to apply the gated clock signal to the flip-flop in response to a clock signal and the clock enable signal.

6. The power-gating circuit of claim 5, wherein the clock gating circuit is configured to generate the gated clock signal by performing an AND operation on the clock signal and the clock enable signal.

7. The power-gating circuit of claim 5, wherein the clock gating circuit is configured to output the clock signal when the clock enable signal is enabled.

8. The power-gating circuit of claim 5, wherein the clock gating circuit is configured to mask the clock signal when the clock enable signal is disabled.

9. The power-gating circuit of claim 5, further comprising:
an input clock buffer configured to buffer and output the clock signal to the clock gating circuit; and
an output clock buffer configured to buffer and provide the gated clock signal to the flip-flop.

10. The power-gating circuit of claim 9, each of the input clock buffer and the output clock buffer includes at least one buffer or inverter.

11. The power-gating circuit of claim 4, further comprising:
a reset circuit configured to generate a reset signal that resets the flip-flop.

12. The power-gating circuit of claim 4, wherein each of the first switch and the second switch is an NMOS transistor.

13. The power-gating circuit of claim 4, wherein each of the first switch and the second switch is a PMOS transistor.

14. The power-gating circuit of claim 4, wherein the first power supply voltage is higher than the second power supply voltage and the flip-flop is configured to receive the second power supply voltage and to operate in an active mode if the clock enable signal is at a high level.

15. The power-gating circuit of claim 4, wherein the first power supply voltage is higher than the second power supply voltage and the flip-flop is configured to receive the first power supply voltage and to operate in a data hold mode if the clock enable signal is at a low level.

16. The power-gating circuit of claim 4, wherein a difference between the first supply voltage and the second power supply voltage is a threshold voltage of the first switch.

* * * * *